United States Patent
Bell, II et al.

(10) Patent No.: US 7,590,951 B1
(45) Date of Patent: Sep. 15, 2009

(54) PLUG-IN COMPONENT-BASED DEPENDENCY MANAGEMENT FOR PARTITIONS WITHIN AN INCREMENTAL IMPLEMENTATION FLOW

(75) Inventors: William R. Bell, II, Longmont, CO (US); William W. Stiehl, Lafayette, CO (US); Emil S. Ochotta, Mountain View, CA (US); W. Story Leavesley, III, Longmont, CO (US)

(73) Assignee: XILINX, Inc., San Jose, CA (US)

( * ) Notice: Subject to any disclaimer, the term of this patent is extended or adjusted under 35 U.S.C. 154(b) by 289 days.

(21) Appl. No.: 11/500,525

(22) Filed: Aug. 8, 2006

(51) Int. Cl.
*G06F 17/50* (2006.01)
(52) U.S. Cl. .................. 716/1; 716/16; 716/17
(58) Field of Classification Search .......... 716/17, 716/1, 2, 8, 9, 16
See application file for complete search history.

(56) References Cited

U.S. PATENT DOCUMENTS

| | | | | |
|---|---|---|---|---|
| 5,436,849 | A * | 7/1995 | Drumm | 716/18 |
| 5,805,861 | A * | 9/1998 | Gilbert et al. | 703/15 |
| 6,102,964 | A * | 8/2000 | Tse et al. | 716/18 |
| 6,298,319 | B1 * | 10/2001 | Heile et al. | 703/26 |
| 6,490,717 | B1 * | 12/2002 | Pedersen et al. | 716/18 |
| 6,871,336 | B1 | 3/2005 | Anderson | |
| 6,996,832 | B2 * | 2/2006 | Gunduc et al. | 719/331 |
| 7,023,744 | B1 | 4/2006 | Shimanek | |
| 7,086,029 | B1 * | 8/2006 | Barras et al. | 716/17 |
| 7,134,112 | B1 | 11/2006 | Anderson et al. | |
| 7,337,100 | B1 * | 2/2008 | Hutton et al. | 703/13 |
| 2002/0162077 | A1 * | 10/2002 | Jeng et al. | 716/1 |
| 2004/0128626 | A1 * | 7/2004 | Wingren et al. | 716/1 |
| 2004/0133860 | A1 * | 7/2004 | Hieter et al. | 716/2 |
| 2005/0125621 | A1 * | 6/2005 | Shah | 711/173 |
| 2005/0172251 | A1 * | 8/2005 | Chang et al. | 716/6 |
| 2005/0240892 | A1 * | 10/2005 | Broberg et al. | 716/11 |

OTHER PUBLICATIONS

U.S. Appl. No. 11/501,156, filed Aug. 8, 2006, Bell II et al.
Xilinx, Inc.; "Development System Reference Guide"; Chapter 3—Incremental Design; Copyright 2005; downloaded from http://toolbox.xilinx.com/docsan/xilinx7/books/docs/dev/dev.pdf; pp. 55-74.
U.S. Appl. No. 11/639,618, filed Dec. 15, 2006, Ochotta.

* cited by examiner

*Primary Examiner*—Paul Dinh
*Assistant Examiner*—Suchin Parihar
(74) *Attorney, Agent, or Firm*—Kevin T. Cuenot; Lois D. Cartier (57) ABSTRACT

A method of managing an incremental implementation flow (incremental flow) for a circuit design can include storing dependency management data for the incremental flow for the circuit design and, from a first application, invoking at least one plug-in software component configured to access the dependency management data for the circuit design. The method further can include identifying partitions of the circuit design that must be run during the incremental flow using the plug-in software component.

20 Claims, 4 Drawing Sheets

PLUG-IN COMPONENT-BASED DEPENDENCY MANAGEMENT FOR PARTITIONS WITHIN AN INCREMENTAL IMPLEMENTATION FLOW

BACKGROUND

1. Field of the Invention

The present invention relates to the field of circuit design and, more particularly, to incremental implementation flow for programmable logic devices.

2. Description of the Related Art

Incremental Implementation Flow (incremental flow) refers to a methodology for processing circuit designs in a manner that attempts to reuse prior implementation results for unchanging portions of the design. Incremental flow typically is used when an incremental change is made to a circuit design intended for use on a target programmable logic device (PLD), such as a field programmable gate array (FPGA). In general, an incremental change can be one that affects one or more portions of the circuit design. Typically, an incremental change neither significantly alters the size of the circuit design nor adversely affects the timing of the circuit design as a whole. Still, an incremental change can be more substantive in that timing may be adversely affected. Examples of incremental design changes can include, but are not limited to, changes to state machines, control logic, or the addition of registers intended to improve performance of the circuit design.

Incremental flow provides several benefits, making it a useful and desirable circuit design technique. One such benefit is that achieving verified results can be accomplished more rapidly. Results from a prior implementation flow likely have undergone significant testing and/or verification. In depth analysis of this sort is critical to ensuring a reliable circuit design. Repeating such analysis each time the circuit design undergoes a minor, or incremental, change can be cumbersome and time consuming, particularly since significant portions of the circuit design remain unchanged. Re-use of previously tested portions of the circuit design can reduce the time needed to arrive at a verified design solution.

Another benefit is that incremental flow supports a "divide and conquer" approach to circuit design. Creating a circuit design that conforms to an established design goal, for example in terms of timing requirements, power consumption, and the like, can be exceedingly difficult and time consuming. In such cases, it is useful to "lock" one or more particularly complex or troublesome portions of the circuit design to prevent further changes to those portions as other sections of the circuit design continue to evolve. The designer can direct his or her attention to the unfinished, evolving portions of the circuit design.

Incremental flow, however, is not without its disadvantages. In performing incremental flow, it often is necessary for multiple software applications to access the same store of dependency management data. Dependency management data can include implementation data from the various phases of incremental flow. When an incremental flow is performed, it often is the case that a different software-based implementation tool is used to perform each phase, i.e. synthesis, translation, mapping, packing, placement, and routing. To perform its allotted task, each implementation tool must access the dependency management data. Typically, each implementation tool includes its own interface for accessing the dependency management data. This can lead to a situation in which a designer must deal with a plurality of different programming interfaces for accessing and dealing with the dependency management data within the context of a single incremental flow.

Another disadvantage is that the individual implementation tools executed during each phase of an incremental flow usually work with dependency management data on a per circuit design basis. That is, if any part of the circuit design, i.e. a particular file of the circuit design project, is out-of-date, the entire circuit design is considered to be out-of-date necessitating re-implementation of the entire circuit design. Other implementation tools are configured to assume, at startup, that the circuit design is out-of-date, and thus, re-implement the entire circuit design.

In other cases, implementation tools attempt to determine which portions of the circuit design must be re-implemented for a given phase of incremental flow. Such tools, however, process the entire design, compare the implementation results with the previous run, and make a determination as to whether the results are the same. This approach is inefficient as the work of implementation is performed prior to the determination of whether portions of the circuit design have been changed and require re-implementation. Further, on some occasions consecutive runs of an implementation tool do not produce the same results. This situation depends upon the precision of the implementation algorithms used by the implementation tool. In such cases, the implementation tool may indicate that a change has been made to a portion of the circuit design since the implementation result differs from a prior run, when in fact the designer made no change.

It would be beneficial to provide a technique for managing and/or accessing dependency management data for incremental flow which addresses the limitations described above.

SUMMARY

The present invention provides methods and articles of manufacture relating to incremental implementation flow (incremental flow) of a circuit design for a programmable logic device (PLD). One embodiment of the present invention can include a method of managing an incremental flow for a circuit design. The method can include identifying dependency management data for the incremental flow and, from a first application, invoking at least one plug-in software component configured to access the dependency management data for the circuit design. Partitions of the circuit design that must be run during the incremental flow can be identified using the plug-in software component.

The plug-in software component can be invoked to access the dependency management data for the circuit design from at least a second application. Identifying partitions of the circuit design can include identifying individual partitions of the circuit design that must be run for a selected phase of the incremental flow. Invoking at least one plug-in software component can include executing a plug-in software component that is associated with the selected phase of the incremental flow.

The method can include generating a list of partitions of the circuit design that must be run for at least one phase of the incremental flow. In one embodiment, for example, identifying partitions can include determining whether a setting for an implementation tool for incremental flow changed from a prior run of the implementation tool for the circuit design and, if so, adding all partitions of the circuit design to a list of partitions to be run. Identifying partitions further can include checking an implementation option corresponding to each partition of the circuit design and adding each partition to a list of partitions to be run according to the implementation option associated with each respective partition. Identifying partitions also can include identifying changed partitions that affect at least one other partition in the circuit design and adding each such partition to a list of partitions to be run.

Another embodiment of the present invention can include a method of managing an incremental flow for a circuit design including providing a plurality of plug-in software components, where each plug-in software component can be associated with a particular phase of the incremental flow of the circuit design, and identifying dependency management data for the incremental flow. The method can include invoking at least one plug-in software component associated with a current phase of the incremental flow to identify partitions of the circuit design that must be re-implemented for that phase and creating a list of partitions of the circuit design that must be re-implemented.

Invoking at least one plug-in software component further can include executing at least one plug-in software component associated with each phase of the incremental flow such that a list of partitions that are to be re-implemented is created for each phase of the incremental flow. Invoking a plug-in software component also can include invoking a same plug-in software component from a plurality of different applications.

In another embodiment, invoking at least one plug-in software component can include evaluating each partition of the circuit design to identify an implementation option indicating whether the partition is to be re-implemented for the current phase of the incremental flow. Invoking at least one plug-in software component also can include determining whether at least one setting of an implementation tool for a current phase of the incremental flow has changed from a prior run of the implementation tool for the circuit design and, if so, adding each partition of the circuit design to the list of partitions. Changed partitions that affect at least one other partition can be selected and added to the list of partitions.

Yet another embodiment of the present invention can include a machine readable storage, having stored thereon a computer program having a plurality of code sections for causing a machine to perform the various steps and/or functions disclosed herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein provide a component-based approach for accessing dependency management data in the context of incremental implementation flow (incremental flow) for a circuit design. As noted, incremental flow refers to a methodology for processing circuit designs in a manner that attempts to reuse prior implementation results for unchanging portions of a circuit design that is to be implemented on a programmable logic device (PLD). In accordance with the embodiments described herein, dependency management data can be accessed using a plurality of plug-in type software components.

The plug-in software components provide a unified mechanism through which dependency management data can be managed and/or manipulated. Each plug-in software component can be loaded and executed by one or more applications, such as implementation tools corresponding to the various phases of an incremental flow. By providing a unified mechanism for accessing dependency management data, the integrity and consistency of the data, as well as the consistency of results from processing the data, can be maintained across multiple applications.

The term "dependency management data", as used herein, can include the implementation data from one or more iterations of an implementation flow in reference to synthesis, translation, mapping, packing, placement, and routing for either an implementation flow or an incremental flow. Dependency management data further can specify the various relationships among different portions of a circuit design. Dependency management data can include one or more implementation options and further can be used to indicate which portion(s) of the circuit design must be re-implemented, or run, for a given phase of an incremental flow.

Dependency management data can be specified on a per partition basis. A partition, as used herein, refers to a portion of the circuit design defined by a user or circuit designer. A partition can define a group or collection of one or more circuit elements. A partition can include a combination of circuit elements organized in a hierarchical fashion as is commonly specified using a hardware description language (HDL), a grouping of a plurality of instances of a particular circuit element, or a single instance of a circuit element. Since partitions support hierarchy, a partition also can include one or more other partitions thereby allowing a circuit designer to specify a hierarchy of partitions. Implementation options relating to the partitions can be passed on from a parent partition to one or more of its child partitions through inheritance. Inheritance, however, can be overridden on a per partition basis, or prevented, if so desired.

Figure 1:
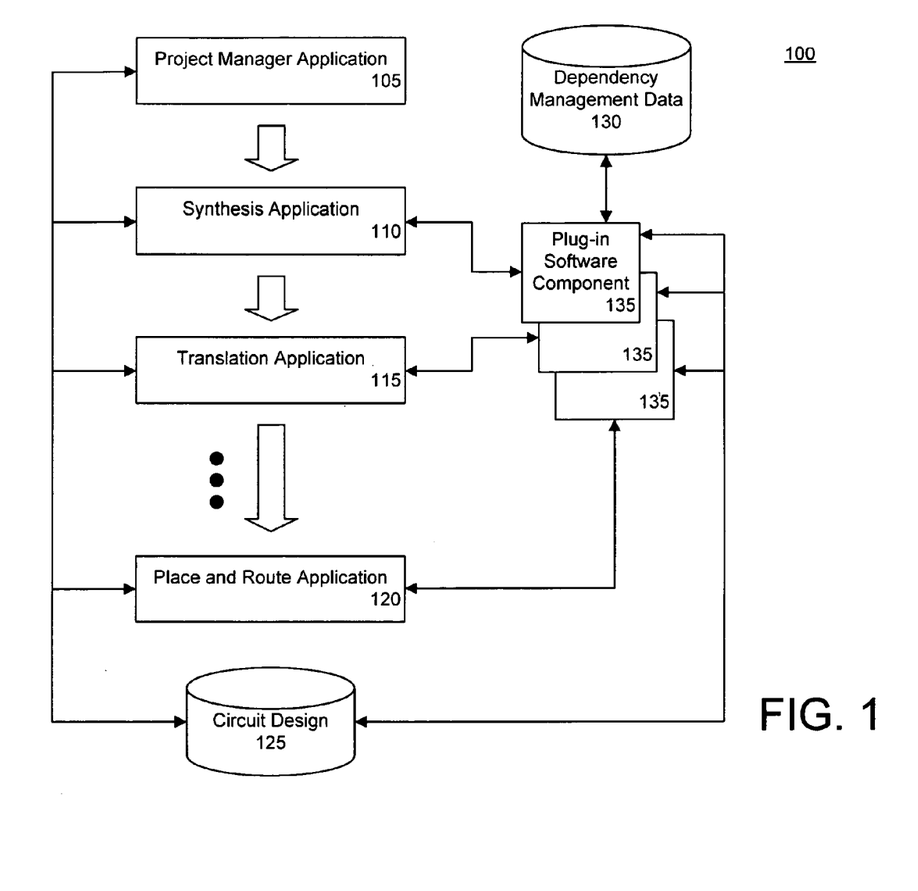
FIG. 1 is a block diagram illustrating a system for managing dependency management data for a circuit design in accordance with one embodiment of the present invention.

FIG. 1 is a block diagram illustrating a system 100 for managing dependency management data for a circuit design in accordance with one embodiment of the present invention. As shown, system 100 can include a plurality of application programs 105, 110, 115, and 120. Each of the applications 105-120 can be a circuit design tool used to manage or perform a particular phase of implementation and/or incremental flow. In one embodiment, for example, system 100 can include a project management application 105 configured to manage and/or control the operation of the various other applications in performing an implementation and/or incremental flow. Accordingly, a synthesis application 110, a translation application 115, as well as a place and route application 120 can be included. Other applications can be included such as mapping and/or packing applications (not shown).

Applications 105-120 can process a circuit design 125 to produce a bitstream that can be loaded into a target PLD thereby implementing the circuit design 125 on the target device. The circuit design 125 can be specified in an HDL such as Verilog or VHDL. System 100 further can include dependency management data 130 as well as a plurality of plug-in software components (plug-ins) 135. In accordance with one embodiment of the present invention, one plug-in can be associated with each phase of the incremental flow. Thus, with respect to system 100, each plug-in 135 can be associated with a particular one of the applications 110-120.

In the context of performing an incremental flow of circuit design 125, each application 110-120 can access and/or manipulate the dependency management data 130 via its corresponding plug-in 135. Each plug-in 135 serves as an interface between one or more applications and the dependency management data 130 as well as the circuit design 125. Thus, rather than each application having its own mechanism for accessing the dependency management data 130 or the circuit design 125, each application 110-120 can call the plug-in 135 associated with that application.

As used herein, a "plug-in" refers a computer program that is loaded under control of a separate application at application runtime. The application and the plug-in communicate via an established interface. This interface effectively limits the actions that can be performed by the plug-in. The plug-in and host application can be modified independently from one another, as long as the agreed upon interface remains intact. Typically, a plug-in is implemented as a dynamically loaded library (DLL) or shared object (SO). The operating system in which the application and plug-in are to execute must be configured to allow the plug-in to be loaded into memory and then treated as part of the executable application thereafter.

In general, the plug-in architecture provides functions including, but not limited to, a method for the application to find the appropriate plug-in(s), a method to load, initialize, and register the contents of the plug-in(s), a method to create instances of the plug-in(s) so that the instances obey the established interface, etc. In one embodiment, an architecture such as Component Object Model (COM) from Microsoft Corporation of Redmond, Wash. can be used. In another embodiment, the Plug-in Component Architecture (PICA) from Adobe Systems of San Jose, Calif. can be used.

In yet another embodiment, the architecture can conform with the following standards: (1) the names of the plug-in(s) used for dependency management can be coded into the application which prevents the plug-in(s) from being changed at runtime; (2) functions such as plug-in initialization and registration with the application can be performed by invoking a function within the plug-in(s) whose name is also hard-coded into the application; and (3) the plug-in(s) can be registered with the application using a unique name, which can be coded into the application. When the application needs a plug-in, the application requests that plug-in using the unique name associated with the plug-in. In any case, it should be appreciated that any of a variety of different plug-in architectures can be used and that the embodiments disclosed herein are not intended to be limited by the particular plug-in architecture selected.

In this case, the plug-ins 135 can operate along with an electronic design automation (EDA) tool or an application configured to perform one or more phases of an implementation or incremental flow as described herein. A plug-in generally utilizes the calling program's user interface and is confined to performing a well-defined set of possible actions. The plug-in typically conforms to a plug-in architecture that is implemented and supported by the application that invokes the plug-in. As a result, a common application programming interface is provided to each application that invokes the plug-in. Because each of the plug-ins 135 conforms to such a plug-in architecture, consistency can be maintained from one plug-in to another regarding the way in which the plug-in is accessed.

Figure 2:
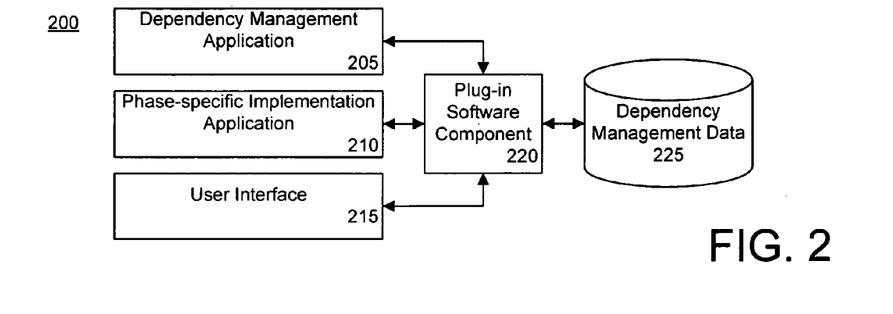
FIG. 2 is a block diagram illustrating a system for managing dependency management data for a circuit design in accordance with another embodiment of the present invention.

FIG. 2 is a block diagram illustrating a system 200 for managing dependency management data for a circuit design in accordance with another embodiment of the present invention. FIG. 2 illustrates the reusability of plug-ins, described with reference to FIG. 1, across a plurality of different applications. As shown, system 200 includes a dependency management application 205, a phase-specific implementation tool 210, and a user interface 215. The dependency management application 205 can be configured to guide the process of incremental flow, and accordingly, the operation of the various implementation tools for a circuit design. The dependency management application 205 can read and/or write to the dependency management data 225. The phase-specific implementation tool 210 can be configured to perform a process such as synthesis, translation, mapping, packing, placement, and routing. For purposes of discussion, however, phase-specific implementation tool 210 can be a synthesis tool. Accordingly, phase-specific implementation tool 210 also can access the dependency management data 225. User interface 215 can be an application that provides a visual representation of one or more items of dependency management data 225, whether in graphic or textual form.

Rather than each application independently accessing the dependency management data 225 through its own interface or set of functions, a common interface can be provided in the form of plug-in 220. As shown, any application that requires access to dependency management data 225 relating to the synthesis phase of incremental flow for the circuit design can utilize a common plug-in, i.e. plug-in 220. Plug-in 220 can provide one or more common functions for evaluating the state of a circuit design in the context of a specific phase of implementation, in this case synthesis. By accessing a common interface, the dependency management data 225 can be accessed in a consistent fashion from one application to the next. Otherwise, it is possible that each respective application could access the dependency management data 225, compute a different value for a same measure or quantity, despite the computation being performed using the same underlying data.

Another benefit of using a plug-in, such as plug-in 220, to access dependency management data 225 is that the details relating to accessing and/or manipulating the dependency management data 225 can be hidden or abstracted from the circuit designer as well as the individual applications that access plug-in 225. Plug-in 225 also can be programmed with one or more functions that are specific to the particular phase of incremental flow to which the plug-in 225 is associated. These phase-specific functions become available to any application that can invoke plug-in 225. In one embodiment, for example, plug-in 225 can be configured to identify portions of a circuit design that must be re-implemented for a specific phase of an incremental flow, i.e. synthesis.

Figure 3:
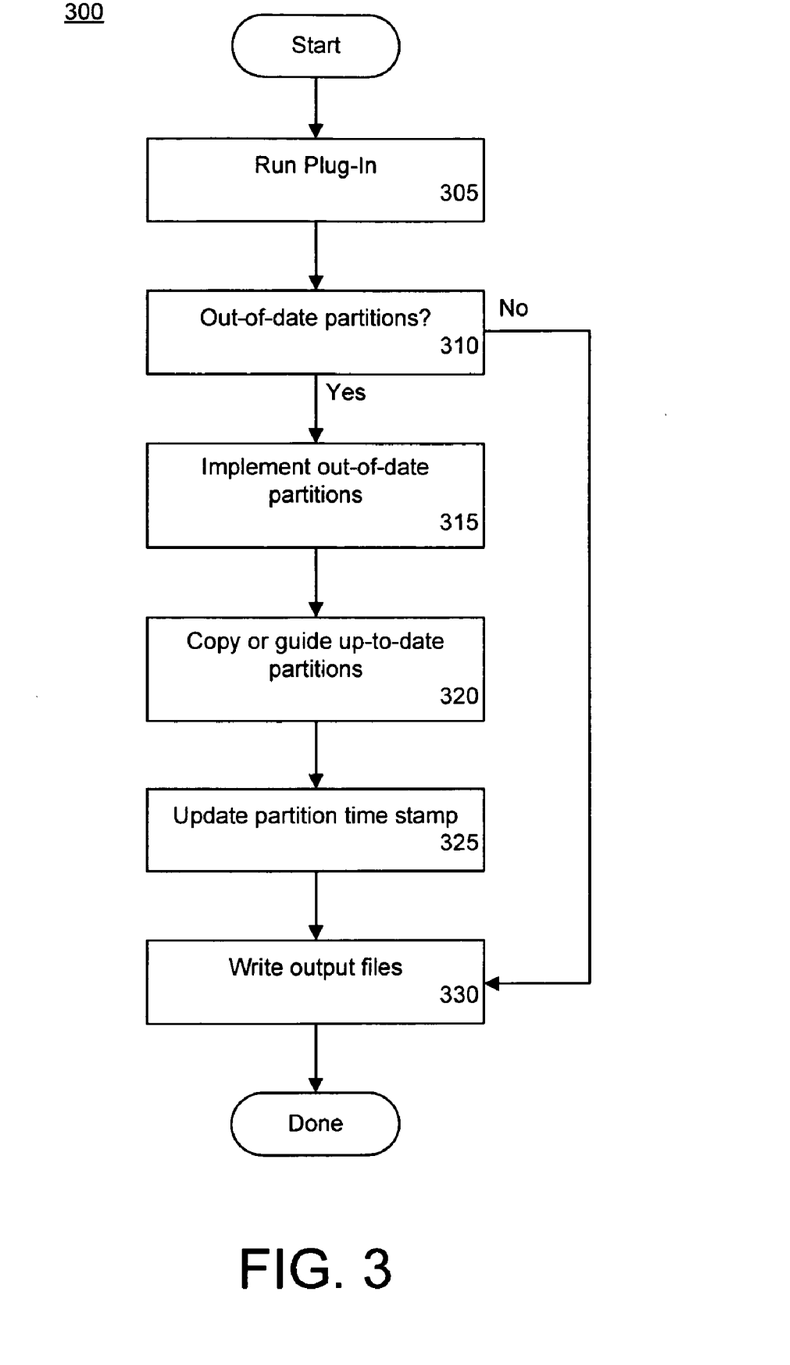
FIG. 3 is a flow chart illustrating a method of managing dependency management data for a circuit design in accordance with another embodiment of the present invention.

FIG. 3 is a flow chart illustrating a method 300 of managing dependency management data for a circuit design in accordance with another embodiment of the present invention. Method 300 illustrates a process for performing a given phase of an incremental flow, i.e. synthesis, translation, mapping, packing, placement, or routing. As such, it should be appreciated that method 300 can be repeated as needed for each respective phase of incremental flow. For example, method 300 can be performed by an implementation tool executing under control of a dependency management application. Accordingly, method 300 can begin in a state where a circuit design has been loaded into an EDA tool capable of performing incremental flow, i.e. a dependency management application.

In step 305, a plug-in can be invoked. In one embodiment, a user input can be provided that indicates the input files, or project, corresponding to the circuit design to be processed as well as the particular phase of incremental flow to be performed, i.e. by referencing a particular implementation tool. Such a user input can be provided through a graphical user interface, via a command line, or the like. The plug-in that is invoked can be associated with the particular phase of incremental flow that is being performed. That is, the plug-in that is invoked is invoked from the implementation tool for the phase of incremental flow being performed. Thus, if the current phase of incremental flow is synthesis, the plug-in associated with synthesis can be invoked by the synthesis implementation tool.

The plug-in can be configured to evaluate the dependency management data for the partitions of the circuit design to determine which partitions have been changed and, as such, must be re-implemented for the current phase of incremental flow. The plug-in can include one or more functions for evaluating the dependency management data for the circuit design on a per-partition basis. Partitions that must be re-implemented, or run, for the current phase of incremental flow can be returned from the invoked plug-in to the implementation tool as a list of partitions that are out-of-date. In step 310, a determination can be made as to whether any out-of-date partitions exist. That is, the implementation tool evaluates the list of out-of-date partitions.

If one or more partitions are out-of-date, in step 315, the out-of-date partitions can be re-implemented, i.e. synthesized, translated, mapped, packed, placed, and/or routed as the case may be according to the current phase of incremental flow. In one embodiment, out-of-date partitions can be re-implemented using a guide technique. The guide technique utilizes results from a prior phase of implementation flow, i.e. synthesis, translation, mapping, packing, placing, and/or routing, for the circuit design. These results, referred to as guide files, are used during incremental flow to guide implementation of unchanged portions of the circuit design. The guide technique performs correlation among the thousands of leaf blocks in the implementation hierarchy. Once correlation has been performed, the guide technique uses the existing infrastructure of the EDA tool for handling circuit design constraints to instruct the implementation tool(s) to reuse the matched logic.

If no partitions are out-of-date, the method can continue to step 330. In that case, since no partitions need to be re-implemented, the output files that are written will be the same as the output files generated from the prior run of the implementation tool for the current phase of incremental flow.

In one embodiment, in step 320, the up-to-date partitions can be copied into the current phase of implementation flow. Any implementation data relating to the current phase for partitions that do not require re-processing can be re-used. As implementation data can be stored within a relational database, implementation data that is to be re-used can be copied from the prior implementation into the incremental flow. Implementation data for partitions that are not re-implemented in the incremental flow can be copied, or grafted, from a relational database used to store the prior implementation data. Grafting the information from a prior flow effectively copies and pastes one or more branches of a hierarchical tree of implementation data into the new implementation. The constraint handling mechanisms of the EDA tool are not used. In another embodiment, up-to-date partitions can be guided as discussed with reference to step 315.

In step 325, the time stamp of each partition can be updated to reflect the current date and/or time. In step 330, the output files for the current phase of incremental flow can be written to memory or disk. In one embodiment, any output files from a prior implementation flow or an incremental flow for the current phase can be overwritten with the newly generated output files. As noted, the method can be repeated as may be required to implement additional phases of the incremental flow. For each phase, a different plug-in can be invoked in step 305, i.e. the plug-in that corresponds to the phase being performed.

Figure 4:
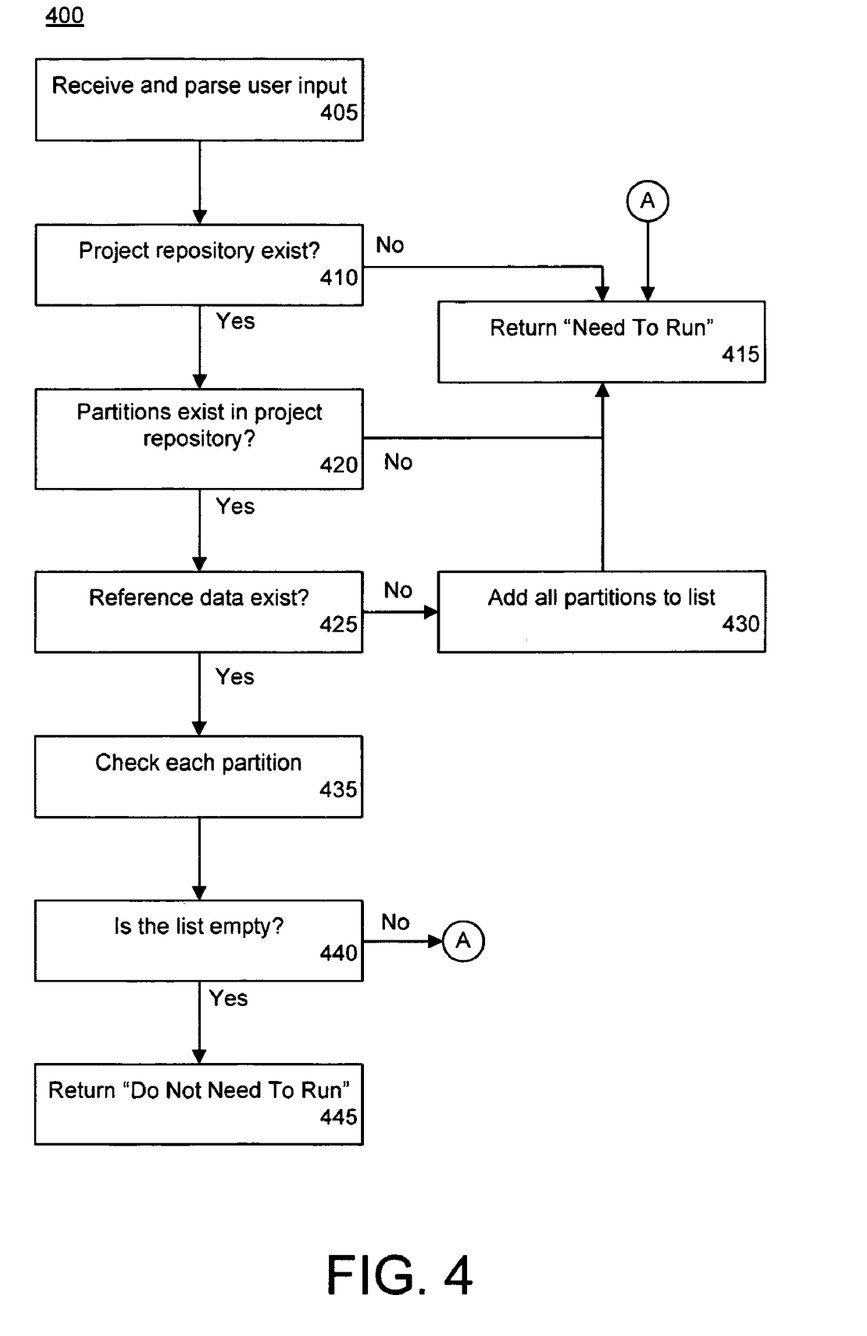
FIG. 4 is a flow chart illustrating a method of operation for a plug-in type software component in accordance with another embodiment of the present invention.

FIG. 4 is a flow chart illustrating a method 400 of operation for a plug-in type software component in accordance with one embodiment of the present invention. FIG. 4 presents a more detailed illustration of step 305 of FIG. 3. Accordingly, method 400 can begin in step 405 where a user input is received and parsed to identify each parameter included in the user input. As noted, the user input can be provided in a variety of different formats.

In step 410, a determination can be made as to whether a project repository exists. A project repository refers to a collection of one or more files corresponding to the circuit design that is processed to implement the circuit design upon a target PLD. As such, the project repository can include the dependency management data for the circuit design. The project repository can be specified in the user input.

If the project repository specified in the user input does not exist, the circuit design has not yet undergone implementation. That is, if no project repository exists for the circuit design, the plug-in can determine that the circuit design has not yet undergone any phase of implementation flow. In that case, the method can proceed to step 415 and return a "need to run" condition. A need to run condition indicates to the implementation tool that invoked the plug-in that the entire circuit design must be implemented.

If a project repository does exist, the method can proceed to step 420 where a determination can be made as to whether partitions exist in the project repository. If a project repository does exist, but no partitions have been defined, it may be the case that the developer has chosen not to utilize partition technology or incremental flow for development of the circuit design. In that case, the method can proceed to step 415 to return a need to run condition.

If partitions do exist, the method can proceed to step 425. In step 425, a determination can be made as to whether reference data exists for the circuit design. Reference data refers to implementation data from a prior run of the currently selected phase of implementation. Thus, for example, if the phase being implemented is mapping, a determination can be made as to whether mapping data exists from a prior run of the mapping implementation tool for the circuit design. If no reference data is found, the plug-in determines that all partitions must be processed as none have been processed thus far. In that case, the method can proceed to step 430, where all partitions of the circuit design are added to a list of partitions to be re-implemented. The method can proceed to step 415 where a need to run condition is returned along with the list of partitions to be run for the current phase of incremental flow.

In step 435, in the case where reference data was found, the plug-in can check each partition to determine whether that partition must be run for the current phase of incremental flow. A variety of different conditions can be evaluated for each partition to determine whether that partition must be re-implemented. Further, it should be appreciated that the analysis performed by a given plug-in can be specific, or tailored, to the particular phase of incremental flow to which that plug-in is associated.

In one embodiment, the plug-in can check the value of a rerun implementation option for each partition. The rerun implementation option determines the circumstances under which the partition is re-implemented by the implementation tools during incremental flow. Possible values of the rerun implementation option can include "auto", "always", "never", and "inherit".

A value of "auto" can indicate to the implementation tools that dependency management is performed such that the partition is re-implemented any time that a determination is made by the appropriate plug-in that the partition is out-of-date. When set to "auto", dependency management data is re-evaluated for the partition. The partition itself, however, is not forced to be re-implemented. Each partition having a rerun implementation option of "auto" and a user input that is newer than stored reference data from a previous implementation of the partition can be added to a list of partitions to be re-implemented for the current phase of incremental flow.

A value of "always" forces the implementation tools to re-implement the partition during each phase of an incremental flow regardless of any changes to the partition. Each partition with a rerun implementation option of "always" is added to the list of partitions. A value of "never" instructs the implementation tools not to re-implement the partition. Such is the case whether or not the partition has been changed and such partitions are not added to the list. A value of "inherit" causes the plug-in to search up the hierarchy of partitions until a value for the implementation option other than "inherit" is found.

In another embodiment, if the user input requesting the performance of the current phase of incremental flow changes, i.e. requests a different setting of the implementation tool for the current phase of incremental flow as compared to the prior execution of the implementation tool for the circuit design, each partition of the circuit design can be added to the list of partitions to be re-implemented. Since one or more settings regulating the manner in which the implementation tool processes the circuit design have changed, it is likely the case that the resulting implementation will be changed for a significant number of partitions. Accordingly, where the settings of the implementation tool are changed, all partitions of the circuit design can be added to the list for re-implementation.

In yet another embodiment, the plug-in can determine whether a change to a partition affects the implementation of another partition with respect to the current phase of incremental flow. In that case, implementation of the changed partition also requires changes to be to the implementation of the affected partition(s). Accordingly, each such changed partition can be added to the list of partitions.

In step 440, a determination can be made as to whether the list of partitions to be re-implemented is empty. If so, the method can continue to step 445 where a "do not need to run" indication is provided back to the implementation application for the current phase. Such a condition indicates that partitions have been defined for the circuit design but that none need be run. If the list is not empty, the method can proceed to step 415 to return a need to run condition as well as the list of partitions to be run for the current phase of incremental flow.

Figure 5:
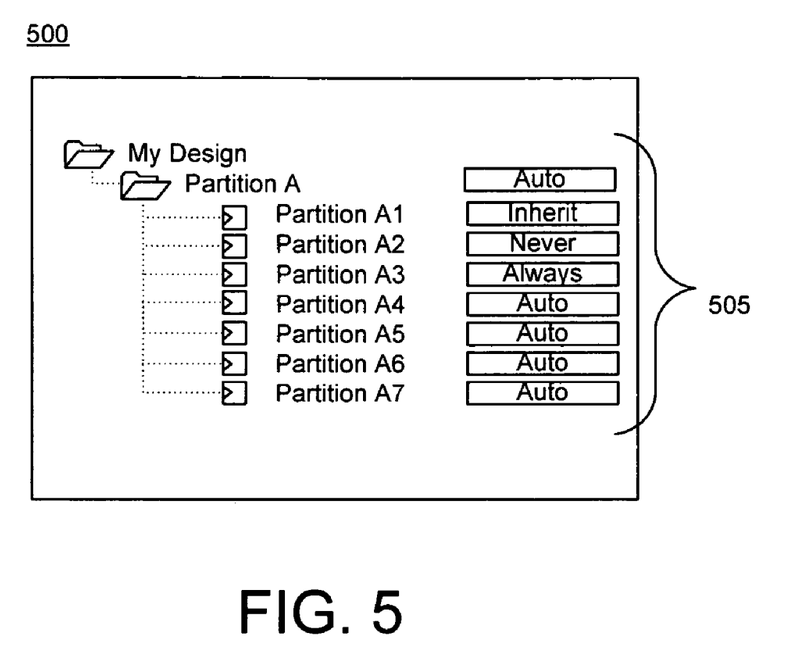
FIG. 5 is a view for use with a graphical user interface in accordance with another embodiment of the present invention.

FIG. 5 is a view 500 for use with a graphical user interface in accordance with another embodiment of the present invention. View 500 illustrates one way in which an application can utilize the plug-ins discussed herein to access dependency management data for a circuit design. View 500, for example, can be incorporated into a user interface application or component of a dependency management application and/or an EDA tool. As such, view 500 can be used to assign implementation options and view implementation options for partitions of a circuit design.

In illustration, a user interface including view 500 can invoke one or more of the plug-ins to read the dependency management data. As noted, dependency management data can include implementation options for partitions of the circuit design. Based upon the values retrieved by the plug-in for the implementation options, the values for such options can be presented to the designer through view 500 or otherwise visually indicated using colors, patterns, check boxes, etc. The designer further can specify implementation options which can be provided to the plug-in via the user interface and written to the dependency management data.

As shown, view 500 presents a graphic representation of a project called "My Design". The project includes a Partition A. Partition A includes a plurality of child Partitions A1, A2, A3, A4, A5, A6, and A7. Each partition includes a text box 505 allowing the designer to specify a value for an implementation option for the corresponding partition and which further indicates the current value for the implementation option. It should be appreciated that while view 500 is depicted with text boxes 505, any of a variety of different graphical user interface elements can be used, i.e. drop down menus, check boxes, radio buttons, or the like, such that a user can specify and/or view the various attributes or options discussed herein. Further, though one attribute is shown for each partition in view 500, each partition can be associated with more than one implementation option.

In one embodiment, text boxes 505 can be used to assign and reflect values to the rerun implementation option. As noted, the rerun implementation option can determine the circumstances under which the partition is re-implemented by the implementation tools during incremental flow. Possible values of the rerun implementation option for a partition can include, but are not limited to, "auto", "always", "never", and "inherit". A value of "inherit" is not supported on the top partition. Accordingly, in the example illustrated with reference to FIG. 5, the value of "inherit" for partition A1 causes the plug-in to look to the parent of partition A1, in this case partition A. The value of the rerun implementation option for partition A is "auto", which is then used for partition A1.

The embodiments disclosed herein facilitate dependency management for an incremental flow of a circuit design on a per-partition basis. By using plug-ins, a common interface for accessing and/or manipulating the dependency management data is made available across a plurality of applications. By invoking plug-ins to access the dependency management data, consistency in the interpretation of such data is also achieved across applications.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language).

This invention can be embodied in other forms without departing from the spirit or essential attributes thereof. Accordingly, reference should be made to the following claims, rather than to the foregoing specification, as indicating the scope of the invention.

What is claimed is:

1. A method of managing an incremental implementation flow (incremental flow) for a circuit design comprising:
    storing, on a computer, dependency management data for the incremental flow for the circuit design, wherein the dependency management data specifies which partitions of the circuit design have changed from a prior implementation of the partitions;
    from within a first application that performs a selected phase of the incremental flow, invoking at least one plug-in software component configured to access the dependency management data for the circuit design, wherein the at least one plug-in software component provides a common interface to the dependency management data for each application that invokes the at least one plug-in software component to perform the selected phase of the incremental flow;
    the at least one plug-in software component identifying partitions of the circuit design that must be run during the selected phase of the incremental flow according to the dependency management data; and
    the at least one plug-in software component indicating, to the first application, which partitions to run during the selected phase of the incremental flow.

2. The method of claim 1, wherein identifying partitions of the circuit design further comprises identifying individual partitions of the circuit design that must be run for a selected phase of the incremental flow.

3. The method of claim 2, wherein invoking the at least one plug-in software component further comprises:
    selecting, from a plurality of plug-in software components, the at least one plug-in software component that is associated with the selected phase of the incremental flow, wherein each of the plurality of plug-in software components is associated with a different phase of the incremental flow and provides at least one function, specific to the phase of the incremental flow associated with that plug-in software component, that evaluates the dependency management data; and
    executing the selected plug-in software component that is associated with the selected phase of the incremental flow.

4. The method of claim 1, wherein identifying partitions further comprises:
    determining whether a setting for an implementation tool for incremental flow changed from a prior run of the implementation tool for the circuit design; and
    if so, adding all partitions of the circuit design to a list of partitions to be run.

5. The method of claim 1, wherein identifying partitions further comprises:
    checking a user specified implementation option corresponding to at least one partition of the circuit design, wherein the implementation option specifies conditions for re-implementing the partition during a particular phase of the incremental flow, wherein the implementation option selectively forces re-implementation of the at least one partition according to a value of the implementation option independently of changes to the at least one partition; and
    adding each partition to a list of partitions to be run according to the implementation option associated with each respective partition.

6. The method of claim 1, wherein identifying partitions further comprises:
    identifying changed partitions that affect at least one other partition of the circuit design; and
    adding each changed partition that affects at least one other partition to a list of partitions to be run.

7. The method of claim 1, further comprising generating a list of partitions for the circuit design that must be run for at least one phase of the incremental flow.

8. The method of claim 1, further comprising, from at least a second application, invoking the plug-in software component to access the dependency management data for the circuit design.

9. A method of managing an incremental implementation flow (incremental flow) for a circuit design comprising:
    providing a plurality of plug-in software components, wherein each plug-in software component is associated with a particular phase of the incremental flow for the circuit design;
    storing, on a computer, dependency management data for the incremental flow, wherein the dependency management data specifies which partitions of the circuit design have changed from a prior implementation of the partitions thereby necessitating re-implementation of the partitions for a selected phase of the incremental flow;

invoking at least one plug-in software component associated with a current phase of the incremental flow to identify partitions of the circuit design that must be re-implemented for that phase, wherein the dependency management data is accessed during implementation only through the at least one plug-in software component, wherein the at least one plug-in software component provides a common interface to the dependency management data for at least one application that invokes the at least one plug-in software component to perform the selected phase of the incremental flow; and creating a list of partitions of the circuit design that must be re-implemented and providing the list of partitions to at least one application that performs a phase of incremental flow.

10. The method of claim 9, wherein invoking at least one plug-in software component further comprises executing at least one plug-in software component associated with each phase of the incremental flow such that a list of partitions that are to be re-implemented is created for each phase of the incremental flow.

11. The method of claim 9, wherein invoking a plug-in software component further comprises invoking a same plug-in software component from a plurality of different applications.

12. The method of claim 9, wherein invoking at least one plug-in software component further comprises evaluating at least one partition of the circuit design to identify a user specified implementation option, wherein the implementation option selectively forces re-implementation of the at least one partition according to a value of the implementation option independently of changes to the at least one partition.

13. The method of claim 9, wherein invoking at least one plug-in software component further comprises determining whether at least one setting of an implementation tool for the current phase of the incremental flow has changed from a prior run of the implementation tool for the circuit design and, if so, adding each partition to the list of partitions.

14. The method of claim 9, wherein invoking at least one plug-in software component further comprises selecting changed partitions that affect at least one other partition and adding the selected partitions to the list of partitions.

15. A machine readable storage, having stored thereon a computer program having a plurality of code sections executable by a computer comprising:

code for providing a plurality of plug-in software components, wherein each plug-in software component is associated with a particular phase of an incremental flow for a circuit design;

code for storing dependency management data for the incremental flow, wherein the dependency management data specifies which partitions of the circuit design have changed from a prior implementation of the partitions thereby necessitating re-implementation of the partitions for a selected phase of the incremental flow;

code for invoking at least one plug-in software component associated with a current phase of the incremental flow to identify partitions of the circuit design that must be re-implemented for that phase, wherein the dependency management data is accessed during implementation only through the at least one plug-in software component, wherein the at least one plug-in software component provides a common interface to the dependency management data for at least one application that invokes the at least one plug-in software component to perform the selected phase of the incremental flow; and code for creating a list of partitions of the circuit design that must be re-implemented and providing the list of partitions to at least one application that performs a phase of incremental flow.

16. The machine readable storage of claim 15, wherein the code for invoking at least one plug-in software component further comprises code for executing at least one plug-in software component associated with each phase of the incremental flow such that a list of partitions that are to be re-implemented is created for each phase of the incremental flow.

17. The machine readable storage of claim 15, wherein the code for invoking a plug-in software component further comprises code for invoking a same plug-in software component from a plurality of different applications.

18. The machine readable storage of claim 15, wherein the plug-in software component comprises code for evaluating at least one partition of the circuit design to identify a user specified implementation option, wherein the implementation option selectively forces re-implementation of the at least one partition according to a value of the implementation option independently of changes to the at least one partition.

19. The machine readable storage of claim 15, wherein the plug-in software component comprises code for determining whether at least one setting of an implementation tool for the current phase of the incremental flow has changed from a prior run of the implementation tool for the circuit design and, if so, adding each partition to the list of partitions.

20. The machine readable storage of claim 15, wherein the plug-in software component comprises code for selecting changed partitions that affect at least one other partition and adding the selected partitions to the list of partitions.

* * * * *